(12) United States Patent
Christenson et al.

(10) Patent No.: US 7,364,625 B2
(45) Date of Patent: Apr. 29, 2008

(54) RINSING PROCESSES AND EQUIPMENT

(75) Inventors: Kurt K. Christenson, Minnetonka, MN (US); Steven L. Nelson, Minnetonka, MN (US); James R. Oikari, New Brighton, MN (US); Jeff F. Olson, Burnsville, MN (US); Biao Wu, Milpitas, CA (US)

(73) Assignee: FSI International, Inc., Chaska, MN (US)

( * ) Notice: Subject to any disclaimer, the term of this patent is extended or adjusted under 35 U.S.C. 154(b) by 787 days.

(21) Appl. No.: 10/152,077

(22) Filed: May 20, 2002

(65) Prior Publication Data

US 2002/0170573 A1 Nov. 21, 2002

Related U.S. Application Data

(63) Continuation of application No. 09/580,757, filed on May 30, 2000, now abandoned.

(51) Int. Cl.
*B08B 3/02* (2006.01)

(52) U.S. Cl. ............... 134/2; 134/3; 134/19; 134/21; 134/26; 134/28; 134/30; 134/31; 134/32; 134/33; 134/34; 134/35; 134/36; 134/37; 134/41; 134/42; 134/902

(58) Field of Classification Search .......... 134/2, 134/3, 19, 21, 26, 28, 30, 31, 32, 33, 34, 134/35, 36, 37, 41, 42, 902
See application file for complete search history.

(56) References Cited

U.S. PATENT DOCUMENTS

| 4,446,115 A | 5/1984 | Endo et al. |
| 4,577,650 A | 3/1986 | McConnell |
| 4,633,893 A | 1/1987 | McConnell et al. |
| 4,695,327 A | 9/1987 | Grebinski |
| 4,736,758 A | 4/1988 | Kusuhara |
| 4,777,970 A | 10/1988 | Kusuhara |
| 4,778,532 A * | 10/1988 | McConnell et al. .......... 134/10 |
| 4,828,751 A | 5/1989 | Kremer |
| 4,868,996 A | 9/1989 | Ohmori et al. |
| 4,871,417 A | 10/1989 | Nishizawa et al. |
| 4,879,041 A | 11/1989 | Kurokawa et al. |
| 4,911,761 A | 3/1990 | McConnell et al. |
| 4,917,123 A | 4/1990 | McConnell et al. |

(Continued)

FOREIGN PATENT DOCUMENTS

JP 10326766 12/1988

(Continued)

OTHER PUBLICATIONS

Translation of JP410256221, Hamaya.*

(Continued)

*Primary Examiner*—Sharidan Carrillo
(74) *Attorney, Agent, or Firm*—Kagan Binder, PLLC (57) ABSTRACT

Described are methods of rinsing and processing devices such as semiconductor wafers wherein the device is rinsed with using a surface tension reducing agent; the method may include a subsequent drying step which preferably incorporates the use of a surface tension reducing agent during at least partial drying; and the method may be performed using automated rinsing equipment; also described are automated rinsing apparatuses useful with the method.

10 Claims, 4 Drawing Sheets

U.S. PATENT DOCUMENTS

| | | | |
|---|---|---|---|
| 4,984,597 A | 1/1991 | McConnell et al. | |
| 5,022,961 A | 6/1991 | Izumi et al. | |
| 5,052,126 A | 10/1991 | Moe et al. | |
| 5,054,210 A | 10/1991 | Schumacher et al. | |
| 5,092,937 A | 3/1992 | Ogura et al. | |
| 5,105,556 A | 4/1992 | Kurokawa et al. | |
| 5,115,576 A | 5/1992 | Roberson, Jr. et al. | |
| 5,151,190 A | 9/1992 | Seiryo | |
| 5,243,768 A | 9/1993 | Fukao et al. | |
| 5,246,023 A | 9/1993 | Breunsbach et al. | |
| 5,249,371 A | 10/1993 | Saito et al. | |
| 5,260,097 A | 11/1993 | Silvestre | |
| 5,271,774 A | 12/1993 | Leenaars et al. | |
| 5,313,966 A | 5/1994 | Sadamori | |
| 5,351,419 A | 10/1994 | Franka et al. | |
| 5,371,950 A | 12/1994 | Schumacher | |
| 5,503,681 A | 4/1996 | Inada et al. | |
| 5,516,730 A | 5/1996 | Pirooz et al. | |
| 5,535,525 A | 7/1996 | Gardner | |
| 5,539,995 A | 7/1996 | Bran | |
| 5,555,634 A | 9/1996 | Uchiyama et al. | |
| 5,571,337 A * | 11/1996 | Mohindra et al. | 134/7 |
| 5,575,079 A | 11/1996 | Yokomizo et al. | |
| 5,593,507 A | 1/1997 | Inada et al. | |
| 5,616,247 A | 4/1997 | Mita et al. | |
| 5,795,458 A | 8/1998 | Miyoshi | |
| 5,882,433 A * | 3/1999 | Ueno | 134/31 |
| 5,896,875 A * | 4/1999 | Yoneda | 134/102.3 |
| 5,951,779 A | 9/1999 | Koyanagi et al. | |
| 5,971,368 A | 10/1999 | Nelson et al. | |
| 6,012,472 A * | 1/2000 | Leenaars et al. | 134/137 |
| 6,067,727 A | 5/2000 | Muraoka | |
| 6,139,645 A | 10/2000 | Leenaars et al. | |
| 6,192,600 B1 * | 2/2001 | Bergman | 34/267 |
| 6,199,298 B1 * | 3/2001 | Bergman | 34/315 |
| 6,219,936 B1 | 4/2001 | Kedo et al. | |

FOREIGN PATENT DOCUMENTS

| | | | |
|---|---|---|---|
| JP | 07022364 | | 1/1995 |
| JP | 410256221 A | * | 9/1998 |
| JP | 10256221 | | 12/1998 |
| SU | 414330 | | 6/1974 |

OTHER PUBLICATIONS

"Ultra-Clean Processing of Silicon Surfaces (UCPSS'94)", 1994, by Acco, pp. 167-170, no month.

"Marangoni wafer drying avoids disadvantages", Contamination Control, Aug. 1996, Solid State Technology, pp. 87-88, 90.

Abstract: B9504-2250E-050, IEEE Transactions on Semiconductor Manufacturing, vol. 8, No. 1, pp. 10-16, Feb. 1995.

Abstract: B9501-2250E-004, IEEE Transactions on Semiconductor Manufacturing, vol. 8, No. 4, pp. 440-446, Nov. 1994.

Abstract: B90075702, Proceedings of the Technical Program of the National Electronic Packaging and Production Conference: NEPCON West '90, pp. 1810-1819, vol. 2, no date.

* cited by examiner

RINSING PROCESSES AND EQUIPMENT

This is a continuation of application Ser. No. 09/580,757 filed May 30, 2000 now abandoned.

The invention relates to a method for rinsing a substrate wherein isopropyl alcohol is used with water in the rinse. The invention further relates to processes including such a rinse step, and equipment useful in employing the processes.

BACKGROUND

Industry spends significant resources in the processing of a variety of commercially important substrate surfaces. Commercial substrates that can require surface processing include, to name a few, materials involved in the manufacture of microelectronic devices such as integrated semiconductor circuits (e.g., semiconductor wafers), display screens comprising liquid crystals, electric circuits on boards of synthetic material (circuit boards), and other commercially significant materials and products. These devices can be fabricated according to a series of processing steps, including one or a number of steps for processing a device surface. Methods for processing these and other substrate surfaces can include steps of cleaning, etching, rinsing, drying, or otherwise processing surfaces of substrates for further processing and use.

Many such processing methods, and a variety of commercial processing equipment, are known for substrate processing. According to their use, substrate surfaces are treated with one or more liquid processing materials followed by rinsing and drying.

With respect to the processing of microelectronic devices, these can require one or more of cleaning, etching, rinsing, and drying, in a contaminant-free environment. Various types of available processing equipment are capable of exposing one or a number of wafer surfaces to different processing fluids (e.g., liquids and/or gase), to accomplish one and preferably a series of surface processing operations. These machines can perform a series of various cleaning and etching steps, followed by rinsing and drying, to a highly contaminant-free surface.

Processing generally includes a series of discrete steps such as a cleaning step followed by a wet etching step. Both of these steps involve application of a suitable treatment chemical to the substrate surface, e.g., a gaseous or liquid cleaning solution or an etching or oxidizing agent. The cleaning, etching, or oxidizing agent must subsequently be removed. This is often accomplished by a separate "rinsing" step, which uses a rinsing fluid such as water to dilute and ultimately wash away the previously-applied materials. Different types of machines accomplish the rinse step in different fashions. Some rinse by immersion of the wafer. Some rinse by spraying fluids onto wafer surfaces. Some machines include the ability to heat wafers or expose wafers to inert environments, some rinse by flowing a liquid past a wafer, and some include the ability to remove liquids with centrifugal force by spinning or rotating the wafers on a turntable or carousel, either about their own axis or about a common axis. Some use combos of these.

After rinsing, the rinsing fluid is desirably removed with a drying step. The rinsing and drying steps are in general, separate processing events. Drying should typically not begin until the substrate surface has been rinsed as completely as possible of contaminants and processing chemicals.

Drying processes can include one or more of the use of heat, dry gases such as nitrogen, centrifugal force, and even the use of certain polar organic compounds such as isopropyl alcohol, 1-methoxy-2-propanol, di-acetone alcohol, and ethylglycol. See e.g., U.S. Pat. Nos. 5,571,337 (Mohindra et al.) and 5,271,774 (Leenaars et al.).

For processing microelectronic devices, certain surface properties are desired. With microelectronic devices and silicon-containing materials in particular, etching the surface is intended to remove surface oxides. It is desirable that the processed surface, after being etched, rinsed, dried, or otherwise processed, exhibits a low amount of surface oxides. Thus, after removing oxides in the etching step, processes are preferred which avoid re-oxidation of the surface during subsequent processing, including rinsing and drying. Instead of forming surface oxides during these steps, it would be desirable for rinsing and drying steps to promote "passivation" of surface silica with hydrogen atoms. Testing a surface by measuring the contact angle between a drop of water and the surface can provide an indication of how well oxides have been removed.

Other desirable properties include minimization of surface particles, electrostatic charge, and water spots.

There exists a continuing need to improve available methods and equipment relating to processing commercial substrates such as microelectronic devices. It is a continuing goal to process substrate surfaces to desired surface properties, e.g., minimal surface particles, electrostatic charge, and water spots. With respect to microelectronic devices, it may also desirable to process substrate surfaces to have desired minimal concentrations of surface oxides; surface composition can be measured by ESCA (Electron Spectrum for Chemical Analysis).

SUMMARY OF THE INVENTION

The present invention relates to methods and equipment for processing substrates such as microelectronic devices, wherein the substrates are rinsed using rinsing fluid and a surface tension reducing agent. The rinsing step can remove etching agent and/or oxidizing agent from a substrate surface. In preferred embodiments of the invention, a wet etched or cleaned substrate is rinsed with a rinsing fluid in an atmosphere comprising a gaseous surface tension reducing agent such as a gaseous alcohol, e.g., isopropyl alcohol. The rinse can be accomplished by repeatedly (e.g., in an alternating fashion) causing respective flows of gaseous surface tension reducing agent and rinsing fluid to contact the device. In particularly preferred embodiments, the rinse is combined with a drying step wherein the device is at least partially dried in an atmosphere comprising a surface tension reducing agent, preferably a gaseous alcohol or ketone such as gaseous isopropyl alcohol. The process can be useful with a variety of substrates and with any of a variety of different types of processing apparatuses such as spray-processing equipment.

It has been discovered that processing a substrate according to the invention, e.g., by rinsing in an atmosphere comprising a gaseous surface tension reducing agent, preferably followed by at least partial drying in the presence of a surface tension reducing agent, can lead to improvements in surface properties of the substrate. This approach has been observed to produce improved surface chemistry, wherein the surface of a microelectronic device will exhibit an improved, relatively lower concentration of surface oxides. The rinsing and optional drying steps promote passivation of the cleaned or etched surface with hydrogen, and help reduce the extent of re-oxidation at the surface and reformation of surface oxides.

The inventive process can also provide the additional benefit of general efficiency. It has been observed that rinsing according to the invention can be completed in a relatively shorter period of time relative to rinsing without the use of surface tension reducing agent, even when carried out at ambient or relatively low temperatures, e.g., from 15 C. to 50 C.

Other properties of a processed substrate can also be improved by the practice of the invention, as exhibited by one or more of improved surface energy, electrostatic surface charge, and particle count. These improvements can be exhibited as increased contact angle, reduction in electrostatic surface charge, and reduction in surface particle count.

An aspect of the invention relates to a method of processing a microelectronic device. The method includes the steps of 1) spraying a rinsing fluid onto a surface of the device in an atmosphere comprising a gaseous surface tension reducing agent, to rinse away etching agent or oxidizing agent; and 2) at least partially drying the device in an atmosphere comprising a surface tension reducing agent.

In another aspect, the invention relates to a method of processing an in-process microelectronic device, the method including: 1) cleaning a surface of the device using an processing solution such as a etching agent or an oxidizing agent; 2) rinsing the processing solution from a surface of the device by spraying a rinsing fluid onto the surface while the surface contacts an atmosphere comprising a gaseous surface tension reducing agent; and 3) at least partially drying the rinsed device in an atmosphere comprising a surface tension reducing agent.

In another aspect, the invention relates to a method of rinsing a microelectronic device, wherein a flow of gaseous surface tension reducing agent is caused to contact a surface of the device; a flow of rinsing fluid is caused to contact the device; and the steps are repeated.

Yet another aspect of the invention relates to a method of rinsing a microelectronic device. The method includes steps of providing a chamber containing a turntable, positioning one or more devices on the turntable, rotating the turntable while the devices are positioned on the turntable, providing a surface tension reducing agent into the chamber; and rinsing a surface of the rotated device with a rinsing fluid.

Yet a further aspect of the invention relates to a system for processing a microelectronic device. The system includes: a chamber in which one or more devices can be positioned during processing; one or more orifices inside the chamber through which a surface tension reducing agent vapor is introduced into the chamber; one or more orifices inside the chamber through which a rinsing fluid is introduced into the chamber; a turntable which causes the one or more devices to rotate or move proximal to the orifices; and a surface tension reducing agent vapor generator comprising a container to contain liquid surface tension reducing agent while maintaining a headspace in the container above the liquid; an orifice in the container to dispense nitrogen into mass transfer contact with the liquid to produce a in the headspace comprising surface tension reducing agent in nitrogen; and an outlet in communication with the headspace and the spraypost and the one or more orifices for dispensing the vapor.

Yet another aspect of the invention relates to a method of processing a microelectronic device. The method includes 1) cleaning a surface of the device with an etching agent or an oxidizing agent; 2) rinsing etching agent or oxidizing agent from the device surface by spraying a rinsing fluid onto the surface while the surface is in contact with an atmosphere comprising a surface tension reducing agent.

DETAILED DESCRIPTION

Commercially available equipment is known for processing commercial substrates such as microelectronic devices. Some such equipment is designed and constructed specifically to process substrates through a series of steps including cleaning, etching, rinsing, and drying, controlled through a series of predetermined steps at preset conditions, within an enclosed, highly controlled (e.g., contaminant-free) environment, to produce processed substrates that are as free as possible from contaminants. One type of useful commercially available apparatus is a spray-processing apparatus such as those available from FSI International, Chaska, Minn., e.g., under one or more of the trade designations MERCURY®, SATURN®, TITAN®, or ZETA®. These and other commercially available processing equipment may be modified to provide a supply of surface tension reducing agent into rinsing and (preferably) drying steps, to perform the methods described herein. Although these specific equipment types can be useful and are specifically mentioned here, the invention is contemplated to be useful in other environments as well, not necessarily requiring any particular design, type, or manufacturer of equipment.

The substrate processed according to the invention can be any of a variety of substrates that require processing, e.g., cleaning, etching, drying, etc. The substrate may be rinsed in order to remove particles, chemicals, or other contaminants from its surface, or to keep them from being deposited on the surface, or the substrate may be rinsed simply to keep the surface wetted. As an example, a substrate may be rinse to remove residual chemical (e.g., cleanser, etchant, or oxidizing agent) present at the substrate surface due to a previous etching or cleaning step. Such substrates are referred to herein as "in-process," e.g., "in-process microelectronic devices." Exemplary microelectronic devices include semiconductor wafers (e.g., made of or containing silicon, gallium arsenide, etc., or similar semiconducting materials, and optionally having other materials coated thereon, e.g., in the form of a film), glass, other types of electrical circuits, other synthetic materials, flat-panel displays, integrated circuits, CD-ROM articles or related materials, liquid crystals, complementary metal-oxide semiconductor (CMOS) substrates and devices, and other like materials. Substrates may have been recently etched or cleaned, and may have a surface that is either hydrophobic or hydrophilic. A hydrophobic surface may benefit from the process of the invention by acquiring a relatively high contact angle, a reduced electrostatic charge, reduced particle count, and improved surface chemistry. Substrates having hydrophilic surfaces may benefit from the process by acquiring, e.g., a reduced particle count or electrostatic surface charge. A reduction in water spots has been observed with both hydrophilic and hydrophobic surfaces.

The rinsing fluid can be any fluid, especially a liquid, that can be applied to a substrate surface, generally as a flow across the surface, and which can be dried to leave a substantially residue free surface. Such rinsing fluids are generally known in the art of processing microelectronic devices, and often comprise water, sometimes with small amounts of various water miscible additives or processing aids, such as surfactants (e.g. a hydrocarbon surfactant). The rinsing fluid may also contain, for example, desired amounts of acid such as HCl or HF; NHuF-buffered HY (BOE), ozone; or a base such as ammonium hydroxide. These are referred to as ozonated water, ultra-dilute HCl, ultra-dilute HF, buffered-oxide-etch (BOE), or ultra-dilute ammonium hydroxide. In some embodiments of the invention, it may be desirable to treat the rinsing fluid by known methods. One such method is to bubble carbon dioxide through the rinsing fluid prior to application to the substrate.

The rinsing fluid can be applied to a substrate surface in any desired fashion, e.g., directed at the substrate at any pressure, velocity, and orientation that will cause rinsing. The rinsing fluid can be in the form of a continuous liquid stream, a pulsed or interrupted stream, a spray, a mist or a stream or spray of atomized particles, and any such a stream may be moving or reciprocating across the substrate surface. The substrate may be oriented vertically, horizontally, or otherwise. The rinsing fluid may be introduced at any angle to or position on the surface, e.g., near an edge or center, in a direction almost parallel to a surface. from a position perpendicular to a surface, or otherwise. In some embodiments of the invention, the use of atomized rinsing fluid has been found to be useful.

The rinsing fluid may be at any useful temperature, and may optionally be heated, depending on the substrate. A general temperature range for the rinsing fluid can be from about 15 to 95 C., but the range used for a given substrate should depend on the substrate, and whether it exhibits any temperature sensitivity. Elevated temperatures are attractive because they can allow faster rinsing action; a rinsing fluid at an elevated temperature may be more effective in dissolving or removing materials from a surface, and an effective rinsing step can take a shorter time. On the other hand, not all substrates can withstand a wide range of elevated temperatures. Some substrates may become roughened or otherwise damaged upon exposure to elevated temperature. For substrates that are temperature stable, for example some hydrophilic semiconductor materials may be able to withstand a rinsing fluid at temperatures as high as 95 C., temperatures in the range from about 50 to 95 C. may be preferred. For other materials, e.g., hydrophobic silicon wafer substrates, which may not be as stable at temperatures above about 37 C. to 50 C., the rinsing fluid temperature may preferably be somewhere in the range from about 15 to 50 C. Still other substrates can be rinsed at a rinsing fluid temperature depending on their ability to withstand a given temperature.

The flow rate and velocity of the rinsing fluid can be any that are effective, and can be optimized to provide a useful rinse of the substrate surface. Velocity and flow rate can be chosen based on factors including the identity and properties of the rinsing fluid, the materials to be rinsed from the surface, and the timing (e.g., duration) of the rinse. An exemplary rinsing fluid flow rate can be from 800 cc to 2 standard liters per minute per 200 to 300 mm substrate at a dispense pressure in the range from 20 to 30 psi, e.g., 22 psi.

The time required to accomplish an effective rinse can depend on various factors including the identity and properties of the substrate and the rinsing fluid, the identity and amount of materials to be rinsed from the surface, the flow rate, velocity, and temperature of the rinsing fluid, etc. In general, a rinse can last in the range up to about 15 minutes. As noted, a rinsing fluid of a higher temperature has been found to be more effective, and can result in an effective rinse in a relatively short period of time at any temperature. This results in a particular advantage when using relatively low rinsing fluid temperatures; the inventive process can allow effective rinses in relatively short periods of time, even with lower temperature rinsing fluid. For example, the method according to the invention may allow a substrate to be effectively rinsed using a rinsing fluid at a temperature in the range from 15 to 50 C., in a time of less than 15 minutes, often less then 7 minutes, or from 2 to 5 minutes.

The rinsing fluid can be from any source and may be at least partially recycled. For application of the invention to certain technologies and substrates, efforts should be made to provide pure, contaminant and particle-free rinsing fluid, e.g., water. This is true when the rinsing method is applied to the processing of microelectronic devices.

According to the invention, a surface tension reducing agent is included in the rinse by rinsing the substrate in an atmosphere comprising at least one surface tension reducing agent. The surface tension reducing agent is preferably at least to some degree miscible with the rinsing fluid. The surface tension reducing agent can be included in the process in the form of a gas or a liquid, and is preferably introduced and present in the rinsing atmosphere at least to some extent in a gaseous form. Thus, agents that are capable of existing in a gaseous form at the processing temperatures are preferred. The surface tension reducing agent can be chosen from alcohols and similar materials, with isopropyl alcohol being preferred.

The surface tension reducing agent can be introduced to or present in the rinsing process in any fashion that will provide some agent at least partially in the form of a gas. Good results have been observed by using a flow of gaseous surface tension reducing agent introduced toward a substrate wetted with the rinsing fluid, optionally and preferably with relative movement between the flow of surface tension reducing agent and the substrate surface. The flow of gaseous surface tension reducing agent can preferably be in the form of surface tension reducing agent vapor in a carrier gas. A variety of carrier gases, generally inert gases, can be used, with nitrogen being one preferred carrier gas.

In general, the amount of the surface tension reducing agent in a carrier gas can be any useful amount, e.g., from greater than zero up to any useful concentration, depending on other factors of the process which can be balanced to compensate for higher or lower concentrations of the gaseous surface tension reducing agent. Preferably, the amount of gaseous surface tension reducing agent in a carrier gas should be less than an amount that would cause undesired condensation of the agent out of its gaseous phase during processing. This threshold amount will vary depending on factors such as the agent, temperature, pressure, flow rate of the vapor mixture, the identity of the carrier gas, the substrate, the materials to be rinsed from the substrate surface, the choice of processing equipment, etc. An example of useful concentrations of gaseous isopropyl alcohol in a nitrogen carrier gas from about 1 to about 6 percent by volume (as measured at standard temperature and pressure). When safety factors and the volatile nature of gaseous isopropyl alcohol are considered, preferred concentrations of gaseous isopropyl alcohol are at the lower end of this range, e.g., from about 1.5 to 3 or 2 to 2.5 volume percent gaseous isopropyl alcohol in nitrogen.

As with the rinse water, certain purity considerations can be involved when the surface tension reducing agent is contacted with certain substrates. For example, as will be understood by those skilled in processing microelectronic devices, high purity surface tension reducing agent should be used to minimize the number of particles that will be present on a surface of a device at the end of processing.

During application of the surface tension reducing agent, the substrate may be oriented vertically, horizontally, or otherwise, and the surface tension reducing agent may be introduced at any angle to or position on the substrate surface, e.g., near an edge direction parallel to and causing flow of the vapor across a substrate surface, from a position perpendicular to the surface, or anywhere in-between. In preferred embodiments, a plurality of substrates can be arranged in a group in a manner that will allow efficient processing of multiple substrates simultaneously. This concept will be understood to those familiar with the art of processing microelectronic devices. Such substrates are conventionally arranged into horizontal or vertical assemblies (rows or stacks of devices with spacing between them), and the like, for efficient processing.

The presentation of the surface tension reducing agent to the substrate, e.g., the flow rate and velocity, and/or the pressure at the point of dispense, can be optimized to provide desired exposure of the substrate to the surface tension reducing agent, given due consideration to the orientation of the substrate and its possible proximity to other substrates. In practice, a useful velocity range of a flow of gaseous surface tension reducing agent, e.g., isopropyl alcohol vapor (as measured at a dispensing orifice) can be a velocity useful to achieve desired rinsing results. A useful velocity within a given rinsing process can depend on factors such as the distance from the dispenser to the substrate surface; the relative orientation of the two; the accessibility of the substrate surface, i.e., whether substrates are configured in a stacked arrangement, and if so the distance between substrate surfaces ("pitch"); the relative motion between the substrate and the orifice and their relative speed; etc. Velocity for a given dispensing mechanism can be controlled by controlling the pressure at dispense. Any variety of combinations of these and other factors will allow a very broad range of useful flow rates and velocities for a gaseous surface tension reducing agent. The velocity of the gaseous surface tension reducing agent can be measured by any standard method, including the use of a conventional pitot tube, as will be appreciated by the skilled artisan.

The volume of surface tension reducing agent exposed to a substrate surface during a rinse process, and the length (in time) of the application, can vary depending on other process parameters. Exemplary flow rates of a mixture of gaseous isopropyl alcohol (at a concentration in the range from 1 to 6 volume percent in a nitrogen carrier gas) can be from about 0 to 0.40 standard cubic feet per minute (SCFM) per 200 to 300 mm silicon wafer substrate. A preferred range can be from about 1 to about 0.35 (SCFM) per 200 to 300 mm silicon substrate. Such a flow rate can be introduced to the substrate for an amount of time effective within a rinsing step, e.g., preferably for a time of less than 15 minutes, e.g., from 2 to 10 minutes. Of course longer or shorter periods can be useful if necessary or desired.

The temperature of the gaseous surface tension reducing agent, e.g., in admixture with a carrier gas, can be any temperature useful to achieve a suitable rinsing effect, and can also vary depending on other process parameters and depending on the substrate being processed. An exemplary range of temperature for isopropyl alcohol vapor in nitrogen is from about 15 C. to about 80 C., e.g., 25 to 80 C. (as measured at an inlet prior to introduction into the rinsing process). Higher or lower temperatures may also be useful, but as with the temperature of the rinsing fluid, the temperature sensitivity of the substrate must be considered.

Surface tension reducing agent and rinsing fluid can be introduced to a substrate in any necessary or convenient order, so long as both rinsing fluid and surface tension reducing agent are part of the rinse, e.g., sequentially, simultaneously, alternately over repeated cycles, or a combination of these. This means that initial introduction of surface tension reducing agent may occur before, during, or after introduction of the rinsing agent. Preferably, the rinse includes application of separate flows of gaseous surface tension reducing agent and rinsing fluid applied to a substrate surface. The flows can be repeatedly and alternately contacted with the substrate, optionally using relative motion between the substrates and the flows, for a number of times and at a frequency sufficient to result in a desired rinsing effect. More specifically, a preferred method includes contacting at least a portion of a substrate surface with a flow of a rinsing fluid, terminating contact between the substrate and the flow of rinsing fluid, contacting at least a portion of the substrate surface with a flow of surface tension reducing agent, terminating the contact between the flow of surface tension reducing agent and the substrate, and repeating the steps. The contact can be initiated and terminated by turning on and off the different flows, but is preferably initiated and terminated by relative motion between the flows and the substrates, e.g., either motion of the flows past a stationery substrate, motion of the substrates past stationery flows, or a combination of these.

In one embodiment, a flow of rinsing fluid is first initiated and intermittently contacted with the substrate, e.g., to remove at least a portion of residual material, while no flow of surface tension reducing agent contacts the substrate. At a relatively short period of time thereafter, e.g., a matter of seconds, such as within about 10 seconds, a flow of surface tension reducing agent is initiated and the substrate is alternately exposed to the separate flows of rinsing fluid and surface tension reducing agent, preferably for the duration of the rinse.

After rinsing, a substrate can be further processed as desired. A typical next step is drying to remove rinsing fluid. This can be accomplished using known methods and materials. Drying can incorporate motion of a substrate, e.g., spinning or rotating using a centrifuge or turntable; exposure to energy or elevated temperature; exposure to a dry gas such as nitrogen; exposure to organic materials, e.g., a surface tension reducing agent such as a gaseous alcohol (e.g., isopropyl alcohol); etc.; or a combination of these. The surface tension reducing agent can be any of a variety of organic materials that effectively facilitate drying, including organic materials such as alcohols or ketones, e.g., preferably in a gaseous form. The use of such materials in drying processes is described, for example, in U.S. Pat. No. 5,271, 774 to Leenaars et al., the description of which is incorporated herein by reference. Preferably, the surface tension reducing agent can be isopropyl alcohol vapor at a concentration in the range from about 1 to about 6 volume percent in nitrogen.

In a particularly preferred embodiment of the invention, the surface tension reducing agent of the rinsing step comprises a flow of surface tension reducing agent continued from the end of the rinsing step, maintained through the beginning the drying step, and through at least partial drying of the substrate. In essence, a continuous flow of surface tension reducing agent overlaps at least a portion of both the rinsing step and the drying step, e.g., the flow of surface tension reducing agent stretches continuously through at least the end portion of the rinse and the beginning portion of the drying step. Such a process has been observed to result in particularly well rinsed substrates.

A wide variety of different types of processing equipment can be used to process substrates according to the invention. Some typical machines are designed to perform various processing steps within a controlled environment, including cleaning, (e.g., wet etching), rinsing, and drying. These steps may be performed differently by machines of different designs. Some machines process a substrate (e.g., rinse) by immersion of the substrate; some process by spraying fluids onto a substrate surface; some machines include the ability to heat wafers or expose wafers to inert environments; and some include the ability to process using centrifugal force by spinning or rotating substrate on a turntable or carousel.

Figure 1:
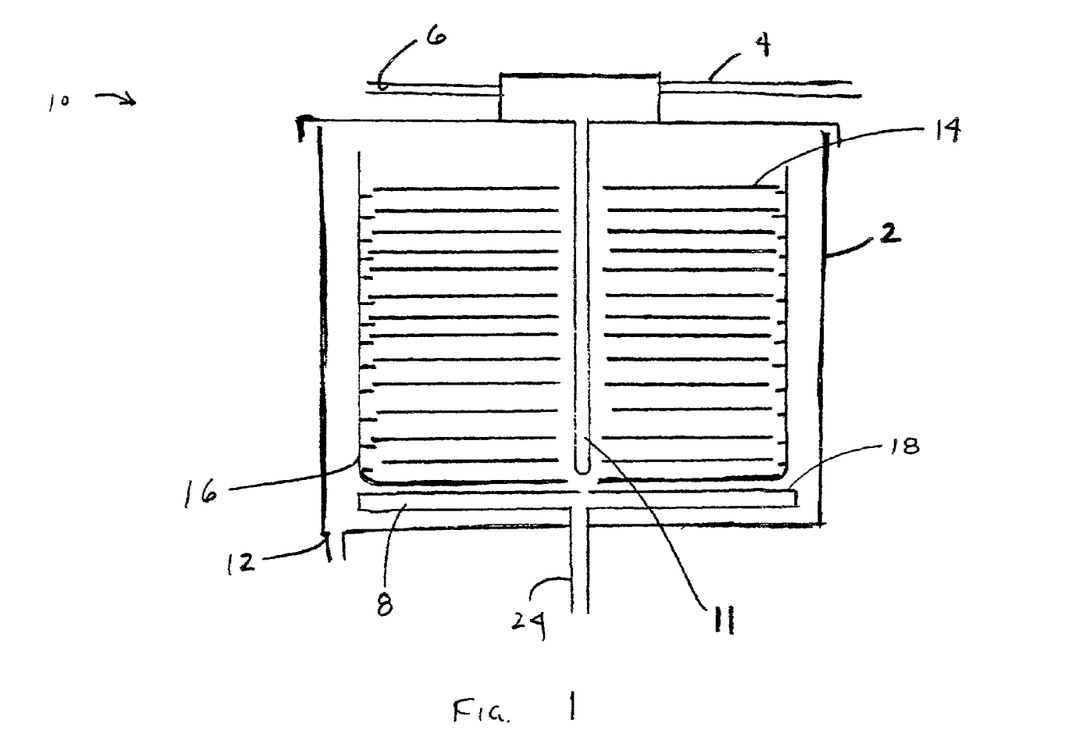
FIG. 1 illustrates a schematic side view of an embodiment of a spray-type processing apparatus of the invention.
Figure 2:
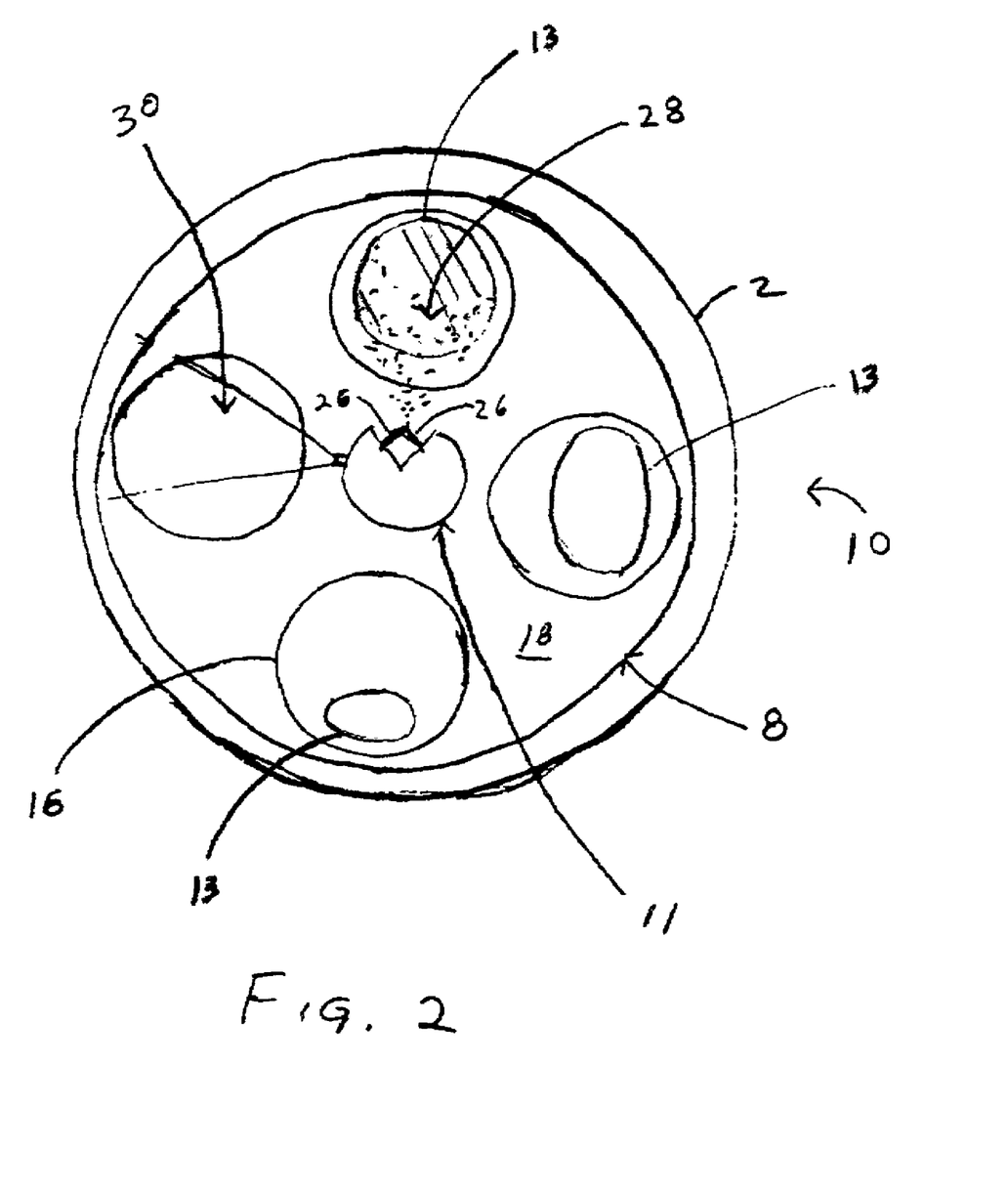
FIG. 2 illustrates a schematic top view of an embodiment of a spray-type processing apparatus of the invention.
Figures 3, 4:
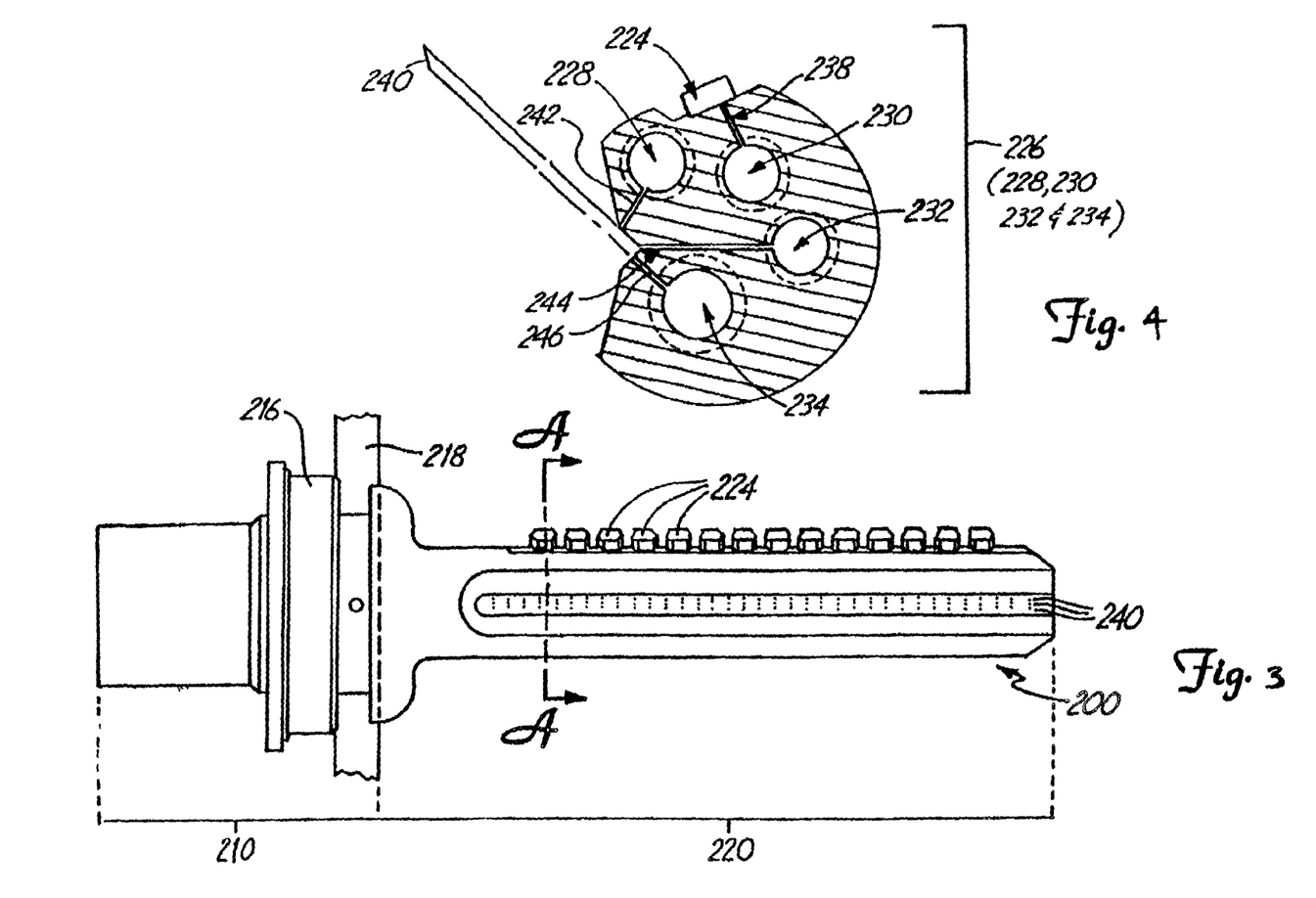
FIG. 3 illustrates a side view of an embodiment of a center spray post for use in apparatuses and methods of the invention.
FIG. 4 illustrates a sectional top view of an embodiment of a center spray post for use in apparatuses and methods of the invention.

Any suitable processing equipment may be used (possibly needing proper modification) to perform the methods of the invention. For application to microelectronic devices, the process may preferably take place within a controlled environment of an automated processing apparatus. Such apparatus may be designed to perform immersive or non-immersive processing techniques and spray processing techniques on multiple substrates, preferably but not necessarily in a batch or semi-batch type process. For example, microelectronic devices may be processed according to the invention using a wet bench or a cascade type system of the type commercially available under the trade designation Omega 1000™, 2000™, or 4000™, from YieldUP International, Inc., Mountain View, Calif. Particularly preferred equipment includes machines designed as centrifugal spray processors, including those commercially available from FSI International, Chaska, Minn., e.g., under one or more of the trade designations MERCURY®, SATURN®, TITAN®, or ZETA®. Any of these types of apparatuses could be modified to facilitate the practice of the invention, e.g., by providing for introduction of a surface tension reducing agent during a rinsing step and preferably at least a portion of the drying step. Centrifugal spray processing systems are particularly advantageous in that they are closed systems, enhancing the safety of the method, and because they are amenable to exposing substrates to alternating flows of surface tension reducing agent and rinsing fluid. One example of such a centrifugal spray processing system, modified to facilitate practice of the invention, is schematically representative of the MERCURY® spray processor is illustrated in FIGS. 1, 2, and 3. An example of a useful spray processing apparatus is described in Assignee's copending U.S. patent application Ser. No. 09/470,153, filed Dec. 22, 1999, and entitled "Compositions and Methods for the Selective Etching of Tantalum-Containing Films for Wafer Reclamation," incorporated herein by reference.

FIG. 1 illustrates a centrifugal spray processing apparatus 10 generally including a chamber 2 designed to contain a number of substrates 14 supported by one or more carrier supports 16, e.g., cassettes, with the carrier supports 16 being supported by a rotatable turntable 8. The chamber can contain a highly contaminant-free environment for processing the substrates according to a predetermined, computer-controlled sequence of events and conditions. The apparatus can perform rinsing as well as pre-rinse and post-rinse processing steps, including wet etching, cleaning, drying, etc.

FIG. 1 further shows surface tension reducing agent supply line 4, rinsing fluid supply line 6, central spray post 11, and exhaust and drain line 12. Turntable 8 includes a top surface 18 to support one or more cassettes 16. Turntable 8 is itself supported on motor-driven shaft 24, which is capable of causing turntable 8 to rotate about an axis central to motor-driven shaft 24. (Other useful spray drying apparatuses may include a turntable that rotates substrates about a center axis of the substrates.) Turntable 8 can be rotated to cause the substrates to travel around center spray post 11, sequentially past respective sets of dispensing orifices for both rinsing fluid and surface tension reducing agent. Exhaust and drain line 12 is provided so that rinsing fluid and condensed surface tension reducing agent may be expelled from chamber 2. A scrubber may be included on the system to remove organic materials from a waste stream. The system can further include a computer and software program (not shown) to monitor and control steps of the process. As is known, automated processing equipment may be controlled using any type of logic device for monitoring and regulating process parameters, e.g., computerized system such as a PC or a PLC. Sensors and a mass flow controller can be included to monitor fluid flows including flow rates, pressures, temperatures, and velocities of surface tension reducing agent in real time.

Each cassette 16 can support substrates 14 spaced a distance apart that will provide for efficient processing of substrates within apparatus 10. A typical cassette (used for 200 mm wafers) might stack substrates to leave a distance of about one eighth of an inch between substrates (this distance is sometimes referred to as "pitch"). A cassette for larger substrates, e.g., 300 mm wafers, might have slightly greater pitch. A cassette may be capable of stacking, supporting, or otherwise arranging a number of wafers, e.g., from about 10 to 50 wafers, often 25, 26, or 50 wafers.

Rinsing fluid supply line 6 can supply rinsing fluid from a source (not shown) to the center spray post 11. Optionally, rinsing fluid supply line 6 may be bifurcated into a center spray post supply line and a side bowl supply line (not shown), which in turn terminate and are operationally coupled to central spray post 11 and one or more side bowl spray posts (not shown) so that rinsing fluid may be delivered from either or both the center or side of chamber 2. Other supply lines (not shown in FIG. 1) provide processing fluids into the chamber such as a wet etching solution (e.g., etching or oxidizing agent) or cleaning solution.

Surface tension reducing agent supply line 4 supplies a surface tension reducing agent such as a gaseous alcohol in a carrier gas, e.g., isopropyl alcohol vapor in nitrogen, through orifices (not shown) on central spray post 11. Preferably, central spray post 11 includes at least one set of orifices for dispensing gaseous surface tension reducing agent in a continuous, relatively uniform manner effective to rinse substrates 14 rotating past the orifices. This may be accomplished using a number of orifices equally spaced and vertically aligned along spray post 11.

The surface tension reducing agent can come from any source of suitably pure liquid or gaseous surface tension reducing agent. FIG. 1 shows surface tension reducing agent supply line 4 leading to spray post 11 through chamber 2. As one possible mode of supplying surface tension reducing agent, a source of suitable liquid surface tension reducing agent can be kept on hand and converted to its gaseous form prior to dispensing it into the chamber. The liquid surface tension reducing agent can be converted to a gas in any desired fashion, for example by heating the liquid using a hot plate located somewhere between the supply of liquid surface tension reducing agent and chamber 2, or by bubbling a carrier gas through a supply of liquid surface tension reducing agent. Using a bubbler, the concentration of the surface tension reducing agent vapor in a carrier gas can be controlled by factors including the pressure and temperature of each, and the flow rate of the carrier gas. A bubbler can operate at any desired temperature, e.g., from about 30 to 50 C., e.g., 45 C. The temperature of the surface tension reducing agent can be further changed, e.g., elevated, via infrared heat, to any useful temperature, with a preferred temperature for some embodiments (where heating is acceptable) being just below the boiling point of liquid surface tension reducing agent, e.g., from about 50 C. to about 80 C. for isopropyl alcohol vapor.

Figure 5:
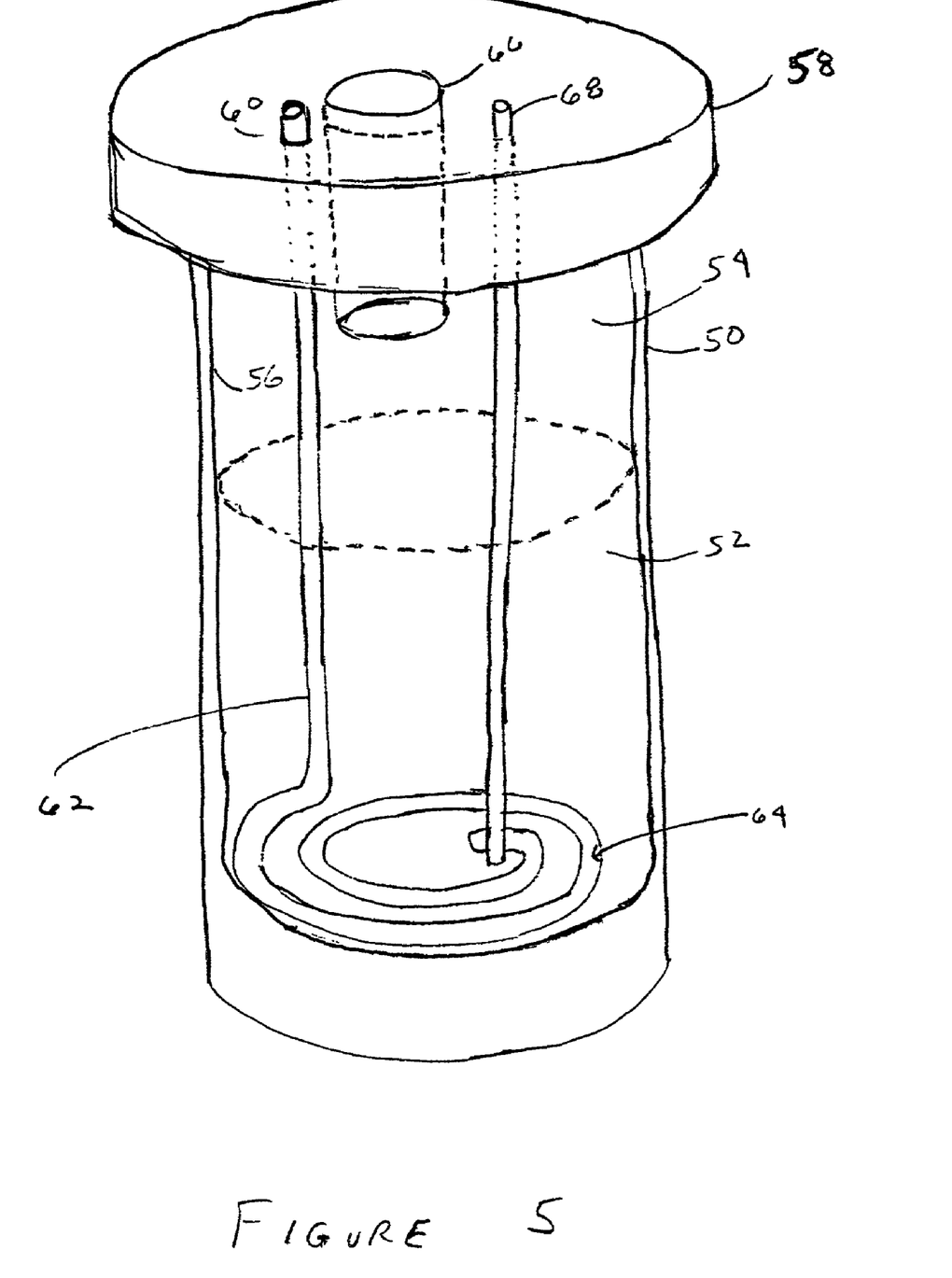
FIG. 5 illustrates an embodiment of a vapor generator useful in the practice of the invention.

An embodiment of a surface tension reducing vapor generator which can be used to supply a gaseous surface tension reducing agent such as an alcohol vapor, e.g., isopropyl alcohol vapor, is illustrated in FIG. 5. The generator includes a container 50 to contain a liquid surface tension reducing agent 52, while maintaining a headspace 54 above the liquid. Interior surface 56 is preferably of stainless steel, preferably polished to a smooth finish, e.g., 10 micro-inch Ra finish. At the top is a cover 58 containing an inlet 60 to allow a flow of nitrogen into tubing 62 extending into the liquid and forming a coil 64 toward the bottom of the container and submerged in the liquid. Outlet 66 extends through top 58 and into the headspace 54. Drain tube 68 extends through top 58, allowing liquid from inside the container to be removed from the container by pressurization. Tubing coil 64 includes multiple orifices (not shown) for dispensing a carrier gas such as nitrogen into the liquid. For example, an embodiment of the generator can include 400 orifices of 0.040 inch diameter. The carrier gas bubbles through liquid 52 to produce a carrier gas containing a vapor of the surface tension reducing agent in headspace 54. The vapor flows through outlet 66 and through a surface tension reducing agent supply line into chamber 2 (see FIG. 1) where it is introduced into the chamber through orifices in the central spray post 11.

The generator may also include other components not shown in the figure, such as stainless steel packing material submerged in the liquid 52 to facilitate mass transfer of surface tension reducing agent into the carrier gas; a heater element; a control mechanism coupled to a concentration analyzer to maintain a desired concentration of the surface tension reducing agent in the carrier gas; and a stainless steel mesh-type filter in line with outlet 66 to prevent mist from leaving the generator. The temperature and pressure of the different components can be controlled to maintain a desired concentration of surface tension reducing agent in the vapor. An increase in the carrier gas pressure will decrease the concentration of surface tension reducing agent, and a higher temperature of isopropye alcohol will increase the concentration of surface tension reducing agent.

Central spray post 11 includes at least one complementary set, and more preferably a plurality of respective complementary sets of orifices through which processing fluids such as rinsing fluid, surface tension reducing agent, etching agents, oxidizing agents, and cleaning agents, etc., can be introduced into chamber 2. Exemplary spray posts such as spray post 11 are described, for example, in U.S. Pat. No. 5,971,368, which is incorporated herein by reference.

FIGS. 3 and 4 illustrate an embodiment of one suitable center spray post 11. Referring to FIG. 3, center spray post 11 is adaptable to apparatus 10 through flange 210, to position nozzle 220 extending into chamber 2. Center spray post 11 includes inlets (not shown) proximal to flange 210, which are in fluid communication with longitudinal passages 228, 230, 232, and 234, which are also in communication with orifices 238, 242, 244, and 246, (see FIG. 4), and which are also in fluid communication with sources of processing fluids (not shown).

Nozzle 220 includes a plurality of fixed orifices 240 arranged in triads, i.e., sets of three, distributed along the length of nozzle 220. (These are shown individually in FIG. 4 as orifices 242, 244, and 246.). Each triad of orifices is arranged so that streams of rinsing fluid can be caused to impinge each other to atomize the streams. That is, the orifices within each triad are preferably directed toward each other in a manner such that streams of fluid ejected from one or more of the orifices will impinge, resulting in the streams being broken into droplets. Alternatively, fluid may be ejected from one of the triad orifices and not be caused to impinge with a second fluid stream, thereby resulting in the delivery of a steady stream of fluid. Nozzle 220 further includes a plurality of fans 224 distributed along the length of nozzle 220. Fans 224, in one embodiment of the system of the invention, can be used as an alternative to stream impingement in order to break up a stream of fluid into sheets or droplets.

FIG. 4 illustrates a sectional view of an embodiment of central spray post 11. FIG. 4 shows a number of internal longitudinal passages fluidly coupling fluid lines and sources of processing fluids with a plurality of orifices 238, 242, 244, and 246. The different orifices of FIG. 4 can be identified as: chemical or solution orifice 242 fluidly coupled with longitudinal passage 228, atomizer 244 fluidly coupled with longitudinal passage 232, rinse orifice 246 fluidly coupled with longitudinal passage 234, and recirculation orifice 238 fluidly coupled with longitudinal passage 230.

Solution orifice 242 (sometimes referred to as the "chemical" port) can typically be used to introduce chemical solutions into the chamber such as cleaning and etching solutions, e.g., sulfuric acid, hydrogen peroxide, ozone, nitric acid, RCA cleaning solution, BOE, or mixtures thereof, and can also be used for introducing rinsing fluid or water into the chamber. A typical solution orifice might have a diameter in the range from about 0.015 to about 0.025, e.g., from about 0.018 to about 0.020.

Atomizer orifice (or "atomizer") 244 can typically be used to introduce nitrogen into the chamber, and is not generally used for other purposes with respect to the process of the invention. A typical diameter of an atomizer orifice is 0.024 inches. According to the process of the invention, it can be preferred to maintain a continuous flow of nitrogen through the atomizer.

Rinse orifice 246 can typically be used in the process to introduce rinsing fluid into the chamber toward the surface of a substrate. The rinsing fluid can be impacted with water introduced at solution orifice 242 to produce an atomized stream of rinsing fluid directed toward the substrates. A typical diameter of a rinse orifice 242 can be in the range from about 0.025 to about 0.030", with the range from about 0.026 to 0.028 being preferred.

The recirculation orifice 238 can typically be used during the process of the invention for dispensing one or more of nitrogen and gaseous surface tension reducing agent. A typical diameter (while not necessarily circular) of atomizer orifice 238 is 0.070". According to the invention, it can be useful while processing occurs to maintain a flow of nitrogen gas (if not gaseous surface tension reducing agent)

through recirculation orifice 238 as a purge to prevent migration of chemicals (e.g., cleaning solutions such as sulfuric acid, or etching solutions) into the orifice, where such a material might otherwise enter and reside and be expelled at a later time into the chamber.

Multiple orifices for each of the solution orifice 242, atomizer 244, rinse orifice 246, and recirculation orifice 238, can preferably be present and evenly spaced along the height of the center spray post (see FIG. 3). The number of each type of orifice along the length of the spray post, as well as the their diameters, can be adjusted to change the velocity of a given flow rate of a fluid through a single orifice or a series of orifices. Exemplary numbers and spacings of orifices for the solution orifice 242, the atomizer 244, and the rinse orifice 246, are about 35 or 65 orifices each, spaced at a pitch to match the pitch of the substrates in the cassette. An exemplary number and spacing of recirculation orifice 238 can be about 15 orifices evenly spaced along the height of a center spray post of approximately 10.5 inches in length, for use with an inside dimension of a spray processing chamber that is about 14 inches in the same direction.

Additional orifices (not shown) may also be present in the chamber, e.g., at or near the turntable, at a side of the chamber in the form of a "sidepost" dispense, or elsewhere. If so, any fluids described herein can be dispensed from such orifices.

In operation, a processing system including apparatus 10 can be used to process substrates such as microelectronic devices using a sequence of any of a variety of steps including cleaning or etching, using materials known to be useful for such purposes, with rinsing and drying steps included where necessary. An exemplary series of steps for processing microelectronic devices according to the invention includes cleaning, an optional rinse with water, wet etching, another rinse in the presence of a surface tension reducing agent (optionally in multiple stages), and drying with at least part of the drying preferably taking place in an environment containing a surface tension reducing agent such as gaseous isopropyl alcohol. Cleaning, wet etching, rinsing with water, and drying steps are known in the art of processing microelectronic devices, and with the present description of a rinse step using a surface tension reducing agent, a skilled artisan will be able to implement such an rinse step into an overall process.

According to the method, substrates 14 are placed into the chamber 2 of an apparatus 10, the substrates being supported by one or more cassettes 16 and the cassettes being supported by turntable 18.

A cleaning step can remove contaminants such as organic materials from substrate surfaces. The cleaning step can take place in an inert atmosphere such as nitrogen introduced into cleaning chamber 2 through one or both of atomizer 244 and recirculation orifice 238.

The cleaning step can involve the application of one or more cleaning fluids to the substrate surfaces, preferably with rotation of substrates 14 about central spray post 11. Exemplary cleaning fluids include acids such as sulfuric acid, nitric acid, hydrochloric acid, and hydroflourine acid; bases, e.g., $NH_4OH$; and oxidizers, e.g., hydrogen peroxides, $H_2O_2$, ozones, and nitric acid. A particularly preferred cleaning fluid comprises a mixture of concentrated sulfuric acid and hydrogen peroxide (sometimes referred to as sulfuric peroxide mix or "SPM"). The cleaning fluids are dispensed in amounts, at flow rates, and for sufficient time to remove organic materials from substrate surfaces. Turntable 8 should be rotated during at least a portion of the process at an effective speed, such as between 20 and 200 rpm. The temperature of the chamber and cleaning fluids can be any effective temperatures, such as from about room temperature (e.g., about 25 C.) to about 95 C.

A next step can be to rinse the cleaning fluid from substrate surfaces, e.g., using atomized deionized water and rotation of the turntable, while maintaining an otherwise inert atmosphere in the chamber. The rinse can be performed by causing a flow of atomized DI water to contact the substrates, preferably dispensed as two water streams 26, one from solution orifice 242 and the other from rinse orifice 246, impinging to form atomized rinsing fluid stream 28 as illustrated in FIG. 2. A preferred turntable speed can be from about 5 to 500 rpm, and a preferred temperature can be from about room temperature to about 95 C.

In general a film will form on the substrate surface, and will run off of the surface due to the centrifugal action of the turntable. It can be preferred to cause oscillation of the thickness of this film between thinner and thicker film thicknesses to facilitate removal of materials from the substrate surface. This can be accomplished by repeatedly changing the speed of the turntable between higher to lower speeds.

Another cleaning step, sometimes referred to as a "wet etch," may follow to remove oxides from the surface of a substrate. The specifics of a wet etch step may vary, but the following exemplary materials and conditions may be useful. Wet etching can generally involve applying to a surface of a microelectronic device a solution of an etching agent (e.g., an acid) that can remove oxides from the surface. Exemplary acid etching agents include hydrofluoric acid (HF), e.g., aqueous HF at any useful concentration, for example up to about 49% aqueous HF, optionally buffered (buffered hydrofluoric acid, (BHF) (also referred to as Buffered Oxide Etching agent or BOE). A standard process for processing 150, 100, or 50 semiconductor substrates having 150 mm, 200 mm, or 300 mm diameter, is to dispense a total of 1.5 to 2.0 liters per minute of HF, DHF, or BHF. This range is for processing the etching agent is dispensed from solution orifice 242 while the turntable rotates the substrates around the center spray post, e.g., at a speed between 100 and 500 rpm, preferably 200 rpm. Preferably, nitrogen dispense continues through atomizer 244.

In practice, termination of etching can automatically trigger a subsequent rinse step to rinse etching agent from substrate surfaces. When transitioning from a wet etch to a rinse, it can be preferred to initially maintain the turntable speed used during wet etching, because some residual etching agent may be present at the substrate surface and a reduction in turntable speed may cause excessive or uneven etching. An example of useful turntable speeds can be as follows. Upon termination of the wet etching step, turntable 8 can be initially rotated at the turntable speed used during the etching step. The dispense of rinsing fluid and/or gaseous surface tension reducing agent can begin and proceed at this turntable speed for a desired time, e.g., long enough to substantially reduce the amount of etching agent on substrate surfaces, usually about 30 seconds. The initial turntable speed can be reduced at some point during the rinse step. A reduced turntable speed also can preferably facilitate rinsing the chamber walls and lid by reducing splatter of rinsing fluid running off of the substrates and impacting the chamber walls. A preferred reduced turntable speed can be in the range from about 20 to 500 rpm.

As is apparent, the substrates 14, while being rinsed according to this description, will move past alternating flows of rinsing fluid and surface tension reducing agent flowing from separate sets of orifices of the central spray post 11. The rinsing fluid and surface tension reducing agent can be directed toward the substrates at desired velocities and flow rates (as affected by dispense pressure), considering factors including the size of the wafer and their speed of rotation past the orifices. The speed of the turntable 8 can be adjusted and coordinated with the dispensing of the surface tension reducing agent and rinsing fluid to provide an effective rinse. The relative speed of substrates 14 past the orifices can be important. Rotational speed of the turntable 8 should be balanced with the velocity and flow rate of the flows of rinsing fluid and surface tension reducing agent; higher fluid flow velocities can be preferred with higher turntable speeds.

The initial introduction of gaseous surface tension reducing agent and rinsing fluid during a rinse step can occur in any order, because each stream is preferably introduced separately. For example, flows of gaseous surface tension reducing agent and rinsing fluid can be initiated at approximately the same time. In practice, with a centrifugal spray-type processing apparatus, substrates move somewhat rapidly past the different orifices. At the moment either the surface tension reducing agent or the rinsing fluid dispense begins, each of the stacks of substrates will be located at different positions within the chamber, e.g., one at or near the surface tension reducing agent orifice and one at or near the rinsing fluid dispensing orifice (see FIGS. 1 and 2). Because the use of a centrifugal spray-type wafer processing apparatus can involve multiple alternating exposures of all substrates to each flow of surface tension reducing agent and rinsing fluid, the exact order of the initial contact of each flow to a substrate seems not to be of high significance. It is sufficient that the flows of gaseous surface tension reducing agent and rinsing fluid are directed at the wafers at sufficient strength and for a sufficient number of cycles to rinse the substrates. In some embodiments of the invention, the flow of surface tension reducing agent can be delayed, e.g., for a matter of seconds after dispensing of the rinsing fluid begins e.g., up to 5-15 seconds, or 10 seconds. This can allow removal of a portion of residual etching agent prior to introduction of the surface tension reducing agent, with the remainder being removed in the presence of surface tension reducing agent, and optionally allowing partial rinsing in the presence of surface tension reducing agent after a substantial portion or essentially all of the etching agent has been removed.

The flow of rinsing fluid is preferably dispensed from central spray post 11 through rinsing orifice 246 and can be at any desired temperature and flow rate (see discussion above), preferably at a temperature in the range from about 15 to 95 C. For spray processing apparatuses similar to those shown in FIG. 1, capable of processing about 150, 100, or 50 wafers of 150 mm, 200 mm, or 300 mm diameter, a preferred total flow rate of rinsing fluid through spray post 11 can be up to about 14 standard liters per minute e.g., 8 standard liters per minute, through the rinse orifices, and 6 liters per minute through the chemical orifices, both at pressures of from 40 to 60 psi, e.g., 55 psi.

The flow of gaseous surface tension reducing agent in nitrogen is preferably dispensed from central spray post 11 through recirculation orifice 238. The flow rate of gaseous surface tension reducing agent should be sufficient to produce an atmosphere that contains a well-mixed amount of surface tension reducing agent. A useful amount can vary depending on process parameters (e.g., turntable speed), and parameters of the equipment and features of the substrate, including the size of the chamber and the size and number of substrates being rinsed. Preferably, when a surface tension reducing agent comprises isopropyl alcohol vapor in nitrogen, the amount of isopropyl alcohol can be an amount that will result in a concentration of isopropyl alcohol within the chamber that approaches saturation point of isopropyl alcohol at the existing temperature and pressure, for instance 90 percent of the saturation point, preferably 95 or 98 percent of the saturation point. For spray processing apparatuses similar to those shown in FIG. 1, capable of processing from about 150 to 50 substrates of 150 mm, 200 mm, or 300 mm diameter, a preferred flow rate of 1 to 6 percent by volume isopropyl alcohol vapor in nitrogen can be up to about 1000 liters per minute, preferably from about 100 to 300 liters per minute.

The velocity of the vapor as it contacts the substrate should be sufficient to cause rinsing without damaging the substrates, and to allow penetration of the vapor into an assembly of stacked substrates. Velocity can be controlled by controlling the pressure of the fluid at dispense, for a given orifice size.

An exemplary combination of flow rates and pressures and turntable speed using isopropyl alcohol vapor in nitrogen and an FSI Mercury MP model centrifugal spray processor, is a turntable speed of 45 rpm; an isopropyl alcohol vapor flow rate of 100 to 300, e.g., 150 SLPM (for a total of 13 orifices having 0.070 inch diameter) at a dispense pressure in the range from 5 to 35 psi; a rinsing fluid flow rate of 1 to 3 SLPM, and a rinsing fluid dispense pressure of 3 to 6 psi.

The rinse can proceed for any period of time useful to provide adequate rinsing of the substrates. In some applications, the rinse can take place in two or more stages that include varying turntable speeds and varying flow rates and velocities of the rinsing fluid and surface tension reducing agent for separate periods of time.

In preferred methods, the rinse step can be separated into an initial high flow rinse wherein rinse fluid is dispensed at a relatively high flow rate (e.g., up to 14 SLPM, e.g., 8-10 standard liters per minute), optionally with a relatively high turntable speed, followed by a low flow rinse using a lower flow rate of rinsing fluid (e.g. 2-3 standard liters per minute), and a lower turntable speed. The high flow rinse and turntable speed are designed to remove the greater portion (e.g., substantially all) of the etching agent from substrate surfaces and from other surfaces inside the chamber. The low flow rinse is to finalize and remove the last small amount of remaining etching agent.

Although the rinse can take place at ambient temperature, it may be desirable to heat one more components of the equipment or process such as the substrate, the surface tension reducing agent, the rinsing fluid, the chamber, or the atmosphere within the chamber, etc. Thus, any of the rinsing fluid or surface tension reducing agent supply lines or the chamber may be equipped with a heating mechanism. Specific examples of useful heating mechanisms include those relating to an isopropyl alcohol generator, and a heating blanket that may be placed over the apparatus to heat the chamber. A blanket heater can be set to a temperature that will maintain the inside of the chamber at any desired temperature, e.g., in the range from about 0 to about 95 C., preferably in the range from about 15 C. to 95 C.

FIG. 2 shows a top schematic view of an embodiment of apparatus 10 during a rinsing step according to the invention. In the Figure, apparatus 10 includes chamber 2, turntable 8 with support surface 18 for supporting cassettes 16, each containing a plurality of stacked semiconducting wafers 14, and center spray post 11. Along the height of the spray post 11 are one or more, preferably a series of orifices for dispensing fluids including surface tension reducing agent, rinsing fluid, nitrogen, and processing chemicals (these components are not numerically designated or shown in FIG. 2). Gaseous surface tension reducing agent 30 is shown being dispensed (to the left in the Figure); streams 26 of rinsing fluid are shown being dispensed and colliding to produce atomized rinsing fluid stream 28.

In the practice of the invention using a spray processing apparatus, it can be desirable to control the manner in which the rinsing fluid and surface tension reducing agent are dispensed onto the substrate surface. The rinsing fluid may preferably be dispensed so that a layer or film of rinsing fluid is formed on the substrate surface. A is layer of rinsing fluid having an appropriate thickness is thought to allow diffusion of the surface tension reducing agent into the layer of rinsing fluid and to the surface of the substrate where rinsing effects and surface properties are favorably affected. The thickness of the layer can preferably be sufficient to allow such diffusion, with a useful thickness depending on factors relating to the overall rinsing process such as temperatures of the different components, the flow rate and velocity of the gaseous surface tension reducing agent and its concentration in a carrier gas, the turntable speed, etc. A useful film thickness can be provided by balancing these variables.

FIG. 2 shows shaded areas 13 on substrates 14. While a layer of the rinse fluid preferably covers the entire area of the substrate surfaces at all positions around the center spray post, the shaded areas graphically represent the thickness and changing thickness of that layer while the substrates move within the chamber. Specifically, the substrate at the top position in FIG. 2 is shown as having the largest shaded area, meaning that the film of the rinse fluid at this position is the thickest. As the substrates move clockwise around the central spray post, centrifugal action reduces the thickness of the film until at the nine o'clock position, where surface tension reducing agent flow 20 is positioned, the film is thinnest, as represented by the size of the shaded area.

In general, a preferred range of thickness for the film in any position can be from about 1 up to about 500 microns, more preferably between 1 and 300 microns. Referring again to FIG. 2, the thickness of the film where rinsing fluid is directed at a substrates as atomized spray 28, can preferably be in the range from about 200 to 300 microns. As the turntable moves the substrate clockwise, the layer of rinsing fluid becomes thinner and by the time the gaseous surface tension reducing agent 30 is introduced (at the nine o'clock position in FIG. 2) the layer of rinsing fluid preferably has a thickness that will allow effective diffusion of the surface tension reducing agent into the layer of rinsing fluid. Such a thickness will depend on process parameters including temperatures and concentration, flow rate, and velocity of the isopropyl alcohol, but thicknesses in the range from about 1 to 30 microns have been found to be useful.

Post-rinse processing can be performed to produce dry substrates, preferably with minimal water spotting and particles. Specific measures can be taken as necessary to purge materials from dispensing lines and ports, followed by drying.

Drying can be accomplished by any of various methods including the use of elevated temperature, dry gas, and rotation of turntable 8. Drying can preferably be accomplished by dispensing dry nitrogen into the chamber at a temperature from about room temperature to 75 C., preferably from 25 to 50 C. (depending of course on the temperature sensitivity of the substrate) with rotation of turntable 8 and continued dispensing of gaseous surface tension reducing agent (e.g., isopropyl alcohol vapor in nitrogen). Nitrogen may be introduced separately or may be supplied solely in the form of the carrier gas for the surface tension reducing agent. The amounts and flow rates of nitrogen and surface tension reducing agent can be any that are useful, and will depend on factors such as the size of the chamber and the number and size of substrates, the amount of residual water, turntable speed, timing of the drying step, etc. It can be preferred to create a drying atmosphere that is nearly saturated with surface tension reducing agent, e.g., 90 percent, 95 percent or 98 percent saturated at the conditions inside the chamber. For spray processing apparatuses such as those described herein, e.g., able to process from about 150 to 50 substrates of 150 mm, 200 mm, or 300 mm diameter, an exemplary flow rate of from about 1 to 6 percent gaseous isopropyl alcohol in nitrogen can be up to about 1000 standard liters per minute, e.g., up to about 300 standard liters per minute. Such a flow rate can last for a time sufficient to result in partial or complete drying of the substrates, e.g., from about 2 to 8 minutes, more preferably 4 to 8, e.g., about 6 minutes.

While the flow of surface tension reducing agent is preferably present during the early portion of drying, it does not necessarily have to continue through the entire drying process, and can be terminated whereafter a drying gas such as nitrogen continues to flow and complete the drying step. The timing of the flows can be any found to be useful. One method found to be useful is to initiate drying with flows of surface tension reducing agent (e.g., isopropyl alcohol vapor) and drying gas (e.g., dry nitrogen). Both flows continue for about half of the total drying time, and when the half-way point is reached, the flow of surface tension reducing agent is terminated, and the remaining portion of the drying process is accomplished using only drying gas. For example, for a drying process that takes a total of 6 to 10 minutes, the flow of surface tension reducing agent might be terminated at from 2 to 5 minutes e.g., at 3 or 4 minutes.

Substrates processed according to the invention can exhibit a clean surface that is sufficiently free of particles and that has surface properties useful in further processing microelectronic substrates. With respect to microelectronic devices, a preferred surface can be one that is substantially free of contaminants with few residual chemicals or particles remaining at the surface. This can mean that the surface is sufficiently free from particles to allow further processing, e.g., fewer than 15 particles per 200 millimeter wafer that are larger than 0.12 micron. Particle count can be measured by known methods, including by laser surface scanning techniques, using equipment such as a Tencor Surfscan Model 6200 or SP1.

The use of a rinse process as described herein has been found to be capable of enhancing one or more surface properties of certain substrates relative to substrates processed in a similar manner but without a rinse step that incorporates a surface tension reducing agent. The improved surface properties may include a reduction in the amount of oxides present on a dried substrate; i.e., improved passivation with hydrogen following removal of oxides in a wet etching step. Other properties that can show improvement, independently or as a consequence of the improved passivation, include one or more of surface energy, particle count reduction, and reduced electrostatic surface charge.

An improved surface energy may result in an improved, e.g., relatively high, contact angle, e.g., a contact angle of at least 80 degrees, e.g., 90 degrees. Methods of measuring contact angle are known; one such method is through the use of a Goiniometer, according to the instruction manual included with such a machine. Goiniometers are commercially available, e.g., from Kruss of Germany.

An improvement, i.e., reduction, in the electrostatic surface charge of a semiconductor wafer substrate can be measured as a surface potential of less than 2 kilovolts at the surface of a 200 mm semiconductor wafer (larger or smaller wafers can have correspondingly low electrostatic charges per area, e.g., 6.5 volts per square centimeter). Standard rinsing can produce microelectronic devices having an electrostatic surface potential of up to or exceeding 15 kvolt. The value in kilovolts is related to the surface area of the wafer; the given values are a 200 mm wafer). Similar 200 mm wafers rinsed in accordance with the present description can exhibit electrostatic surface potentials values as low as 5 kvolts, 2 kvolts, or even approaching or substantially equal to 0 kvolt. Larger or smaller wafers can have similarly low electrostatic surface charges, corresponding to their surface area. It has been observed that the more a semiconductor wafer is exposed to a surface tension reducing agent (e.g., isopropyl alcohol vapor) during a rinse step, the lower its electrostatic charge will become. Thus, the longer the rinse cycle including a surface tension reducing agent continues, the lower the electrostatic charge of a substrate can become, even down to a value approaching zero or effectively equal to zero.

The process of the invention can have particularly advantageous effect in the manufacture of complementary metal-oxide semiconductor (CMOS) substrates and devices, which can be particularly sensitive to electrostatic charge.

The surface chemistry of a substrate, and any improvement in the surface chemistry, can be analyzed using known analytical techniques and equipment, such as ESCA. An improved surface chemistry with respect to silicon-containing wafer substrates can be exhibited as one or more of a reduction in the amount of $Si^+$ and O, or an increase in an amount of $Si^0$ or Si.

Following is a single non-limiting, example of a method of processing a group of substrates, using steps and parameters that have been found to be useful in an FSI Mercury MP spray processing apparatus.

A quantity of 25 semiconductor wafers of 200 mm diameter were placed in four cassettes (a total of 100 wafers) and each cassette was placed in the apparatus. The chamber was filled with nitrogen by dispensing approximately 5 cubic feet per minute (cfm) of nitrogen gas (at standard temperature and pressure inside the chamber), through the atomizer, and simultaneously dispensing 5 cfm of nitrogen gas through the recirculation orifice. Each wafer was exposed to approximately 7.5 cc of a sulfuric peroxide mix (SPM) as follows. Sulfuric acid ($H_2SO_4$) (99%) was dispensed at 600 cubic centimeters per minute (cc/m) for 5 minutes through the solution orifice, simultaneously with 150 cc/minute of hydrogen peroxide ($H_2O_2$) (39%) for 5 minutes through the chemical orifice. Turntable 8 was rotated throughout the 5 minute process at a about 20 revolutions per minute (rpm).

The cleaning materials ($H_2SO_4$ and $H_2O_2$) were rinsed from the wafer surfaces by applying approximately one liter of atomized DI water to each wafer, dispensed as two water streams collided to form atomized rinsing fluid stream as illustrated in FIG. 2. The rinse was preferably accomplished in two stages of different cycles. A first stage involved repeating the following cycle four times: 20 seconds at 500 rpm; 5 seconds at 60 rpm; 25 seconds at 60 rpm; and 15 seconds at 20 rpm. The second stage involved 3 repetitions of the following two-step cycle: 45 seconds at 500 rpm; and 45 seconds at 20 rpm.

The wafer surfaces were then wet etched with dilute HF (1:100 of HF in DI water, "DHF"). A total of 1.5 to 2.0 liters per minute for 2 minutes was dispensed from the chemical orifice while the turntable rotated the wafers at approximately 160 rpm for approximately 120 seconds. This took place in combination with a continuous atomized nitrogen dispense from the atomizer of 10 SCF minute.

A high flow rinse was then carried out to remove etching agent from the wafer surfaces by dispensing a total flow rate of about 14 liters per minute, i.e., 8 liters per minute from converging stream 26 (FIG. 2) at the water dispense, and 6 liters from solution dispense orifices on the center spray post. This rinse was accompanied by dispensing 145 standard liters per minute (SLPM) of isopropyl alcohol vapor (2% or 6% by volume in nitrogen) through the recirculation orifices 238, starting 10 seconds after the flow of water was initiated. The turntable was rotated during the high speed rinse, initially at 160 rpm, and slowed to approximately 90 rpm after 90 to 180 seconds into the rinse. The total length of the rinse with IPA lasted from 90 to 180 seconds, e.g., 120 seconds.

A low flow rinse followed, of approximately 2.4 standard liters of DI water per minute through the rinse and solution orifices at 3 to 6 psi (1200 cc/side, for total of 2400 cc), in combination with 145 SLPM of 6 volume percent isopropyl alcohol vapor in nitrogen through the recirculation orifice at 5 to 30 psi. The turntable speed was at a speed in the range from 20 to 45 rpm, e.g., 30 rpm, and the rinse lasted about 90 seconds.

Following the low flow rinse was a line purge to remove water from the wafer rinse and solution lines (not through the center spray column, but through an outlet outside of the chamber). To purge the lines, a flow of 150 SLPM of nitrogen gas at approximately 20 psi was processed through the lines and out an external outlet (in the lines, but not in the chamber) for a time of about 90 seconds. The dispense of isopropyl alcohol vapor in nitrogen was continued through the recirculation ports.

A low pressure purge of the center spray column followed, wherein nitrogen was directed through the spray column in an amount and at a pressure to gently expel the water from the rinse water and solution orifices on the center spray post so that the water ran down the spray post without producing water drops on substrates. This was done with a flow of nitrogen through the center spray post orifices at relatively low pressure and flow rate (7-10 psi at 3-7 SLPM). Isopropyl alcohol vapor in nitrogen continued to flow through the recirculation orifices at approximately 150 SLPM.

A final dry was accomplished by termination of all flows except for the isopropyl alcohol vapor in nitrogen from the recirculation orifice, at a flow rate of about 300 standard liters per minute. The turntable was rotated at a speed of 500 rpm, and the process lasted for 30 seconds with flow of isopropyl alcohol vapor and nitrogen, followed by six minutes of only dry nitrogen gas.

Substrates processed according to these steps exhibited favorable surface properties including one or more of an improved surface free energy, electrostatic surface charge, particle count, and surface chemistry, as compared to substrates processed by similar methods but not including surface tension reducing agent in the rinse.

The following table shows data comparisons of substrates processed according to the invention using either 2% or 6% isopropyl vapor in nitrogen, relative to substrates that were similarly processed in the absence of any surface tension reducing agent in the rinse step (standard rinsing and drying).

TABLE

HF Last Process Using IPA in Final Rinse and Dry for Hydrophobic Wafer

| Test | Standard Dry | 2% IPA Vapor | 6% IPA Vapor |
|---|---|---|---|
| Particle Count | +36 @ 0.15 micron | +20 @ 0.15 micron | +17 @ 0.15 micron |
| Electrostatic surface potential | 15 Kv | 10 Kv | <1 Kv |
| Contact angle | 65° | 76° | 89° |
| Drying time | 15 minutes | 6.5 minutes | 6.5 minutes |

Another group of substrates was processed as described above, except than no wet etch was performed, but the wafers were instead cleaned using RCA cleaning fluid, and resulted in the hydrophilic surface.

| Test | Standard Dry | 2% IPA |
|---|---|---|
| Particle Count | −10 to 24 @ 0.12 micron | −2 to 2 @ 0.12 micron |
| Drying time | 6 minutes | 6 minutes |

We claim:

1. A method of processing a microelectronic device as rotatably supported within a processing chamber, the method including the steps of:
   creating an atmosphere comprising gas within the processing chamber and about a surface of the microelectronic device supported within the processing chamber;
   rinsing the microelectronic device by spraying a rinsing fluid onto a surface of the device within the gas atmosphere while rotating the device at a first rotational speed and also supplying a surface tension reducing agent into the gas atmosphere within the processing chamber; and
   drying the device by changing the first rotational speed to a second rotational speed, and, during at least an initial portion of the drying step with the device rotating at the second rotational speed, directing a drying gas into the processing chamber while also continuing to supply the surface tension reducing agent into the gas atmosphere within the processing chamber.

2. The method of claim 1 wherein the rinsing fluid comprises water.

3. The method of claim 1 wherein the surface tension reducing agent of the rinsing step comprises an alcohol.

4. The method of claim 1 wherein the surface tension reducing agent of the rinsing step comprises isopropyl alcohol.

5. The method of claim 1 wherein the surface tension reducing agent of the drying step comprises isopropyl alcohol.

6. The method of claim 1 wherein the surface tension reducing agent of the rinsing step comprises from about 1 to 6 volume percent isopropyl alcohol gas in a carrier gas.

7. The method of claim 1 wherein the temperature of the rinsing fluid at the surface of the device is in the range from about 15 to 90° C.

8. The method of claim 1, wherein the drying gas is provided as a carrier gas along with the surface tension reducing agent.

9. The method of claim 1, wherein the drying gas is provided as a gas that is introduced separately into the processing chamber from the surface tension reducing agent.

10. The method of claim 6 wherein the isopropyl alcohol and carrier gas are dispensed at a temperature in the range from about 15 to 50° C.

* * * * *